United States Patent
Blanchet-Fincher et al.

(10) Patent No.: US 7,259,443 B2
(45) Date of Patent: Aug. 21, 2007

(54) METHODS FOR FORMING PATTERNS ON A FILLED DIELECTRIC MATERIAL ON SUBSTRATES

(75) Inventors: Graciela Beatriz Blanchet-Fincher, Greenville, DE (US); Karyn B. Visscher, Voorhees, NJ (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/877,739

(22) Filed: Jun. 25, 2004

(65) Prior Publication Data

US 2005/0082523 A1  Apr. 21, 2005

Related U.S. Application Data

(60) Provisional application No. 60/483,866, filed on Jun. 26, 2003.

(51) Int. Cl.
H01L 29/06 (2006.01)
H01L 23/48 (2006.01)

(52) U.S. Cl. ............... 257/618; 257/763; 257/E23.003

(58) Field of Classification Search ............... 257/618, 257/629, 632, E29.026, 763, E23.003
See application file for complete search history.

(56) References Cited

U.S. PATENT DOCUMENTS

| | | | | |
|---|---|---|---|---|
| 3,720,632 | A * | 3/1973 | Argabright et al. | 521/131 |
| 4,720,527 | A * | 1/1988 | Caporiccio et al. | 525/403 |
| 5,512,131 | A * | 4/1996 | Kumar et al. | 438/738 |
| 6,177,151 | B1 | 1/2001 | Chrisey et al. | |
| 6,239,355 | B1 * | 5/2001 | Salafsky | 136/250 |
| 6,303,943 | B1 * | 10/2001 | Yu et al. | 257/40 |
| 6,465,953 | B1 * | 10/2002 | Duggal | 313/553 |
| 6,515,314 | B1 * | 2/2003 | Duggal et al. | 257/184 |
| 6,586,764 | B2 * | 7/2003 | Buechel et al. | 257/40 |
| 6,602,731 | B2 * | 8/2003 | Andriessen | 438/29 |
| 6,706,551 | B2 * | 3/2004 | Andriessen | 438/99 |
| 6,861,674 | B2 * | 3/2005 | Perlo et al. | 257/81 |

(Continued)

FOREIGN PATENT DOCUMENTS

WO   02/070271 A2   9/2002

(Continued)

OTHER PUBLICATIONS

Kim, G. et al., Polymeric Organic-Inorganic Composite Gate Insulating Materials for TFTs, IDW '00 Proceedings of the Seventh International Display Workshops, Nov. 29 - Dec. 1, 2000, p. 275-278, International Conference Center Kobe, Kobe Japan.

*Primary Examiner*—Ngân V. Ngô

(57) ABSTRACT

Methods of forming a pattern of filled dielectric material on a substrate by thermal transfer processes are disclosed comprising exposing to heat a thermally imageable donor element comprising a substrate and a transfer layer of dielectric material. The exposure pattern is the image of the desired pattern to be formed on the substrate, such that portions of the layer of dielectric material are transferred onto the substrate where the electronic device is being formed. The filled dielectric material can be patterned onto a gate electrode of a thin film transistor. The pattern dielectric material may also form an insulating layer for interconnects. Donor elements for use in the process are also disclosed. Methods for forming thin film transistors and donor elements for use in the thermal transfer processes are also disclosed.

8 Claims, 9 Drawing Sheets

Schematic of a typical donor element and a typical receiver element.

U.S. PATENT DOCUMENTS

| | | | |
|---|---|---|---|
| 6,878,871 B2* | 4/2005 | Scher et al. | 136/252 |
| 2002/0172887 A1 | 11/2002 | Wolk et al. | |
| 2003/0016196 A1* | 1/2003 | Lueder et al. | 345/82 |
| 2003/0094626 A1* | 5/2003 | Duggal et al. | 257/184 |
| 2003/0188776 A1* | 10/2003 | Li et al. | 136/244 |
| 2004/0004433 A1* | 1/2004 | Lamansky et al. | 313/506 |
| 2004/0040594 A1* | 3/2004 | Andriessen | 136/263 |
| 2004/0061107 A1* | 4/2004 | Duggal | 257/40 |
| 2004/0084080 A1* | 5/2004 | Sager et al. | 136/263 |
| 2004/0169176 A1* | 9/2004 | Peterson et al. | 257/59 |
| 2005/0029610 A1* | 2/2005 | Nishikitani et al. | 257/431 |
| 2005/0208697 A1* | 9/2005 | Seo et al. | 438/82 |
| 2005/0211294 A1* | 9/2005 | Chittibabu et al. | 136/263 |

FOREIGN PATENT DOCUMENTS

| | | |
|---|---|---|
| WO | 03/035279 A1 | 5/2003 |

* cited by examiner

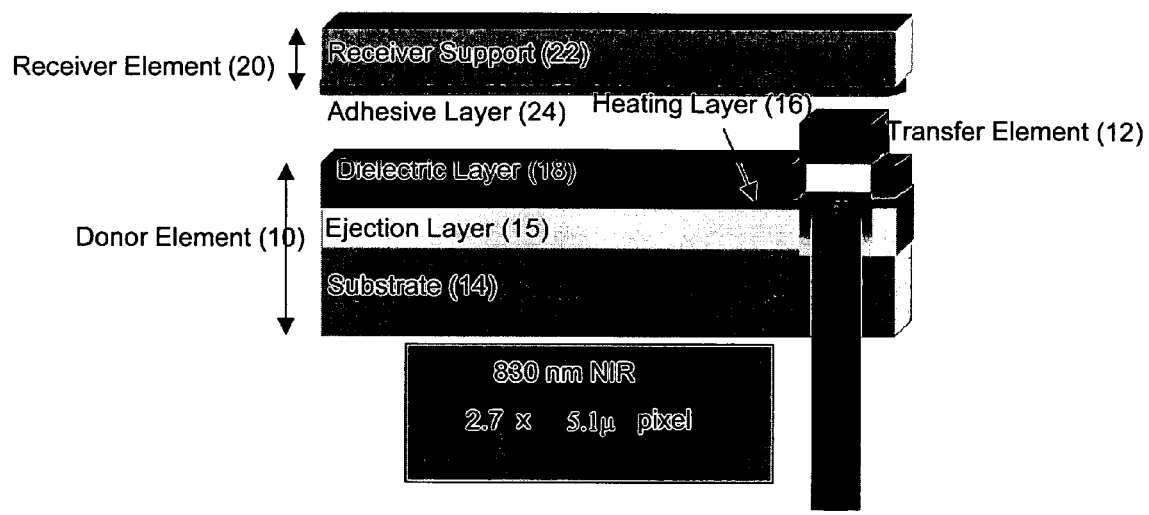
Figure 1: Schematic of a typical donor element and a typical receiver element.

Figure 2: Representation of the thermal transfer process
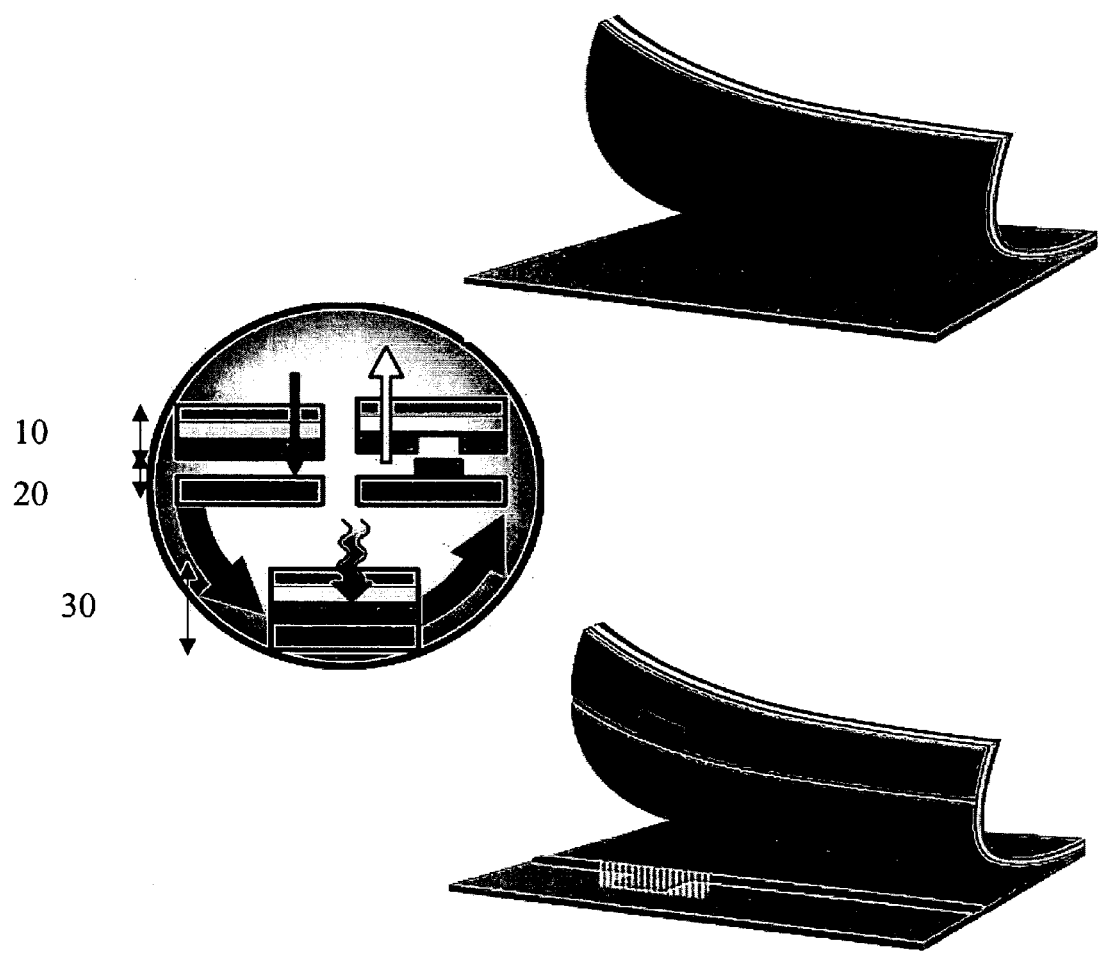

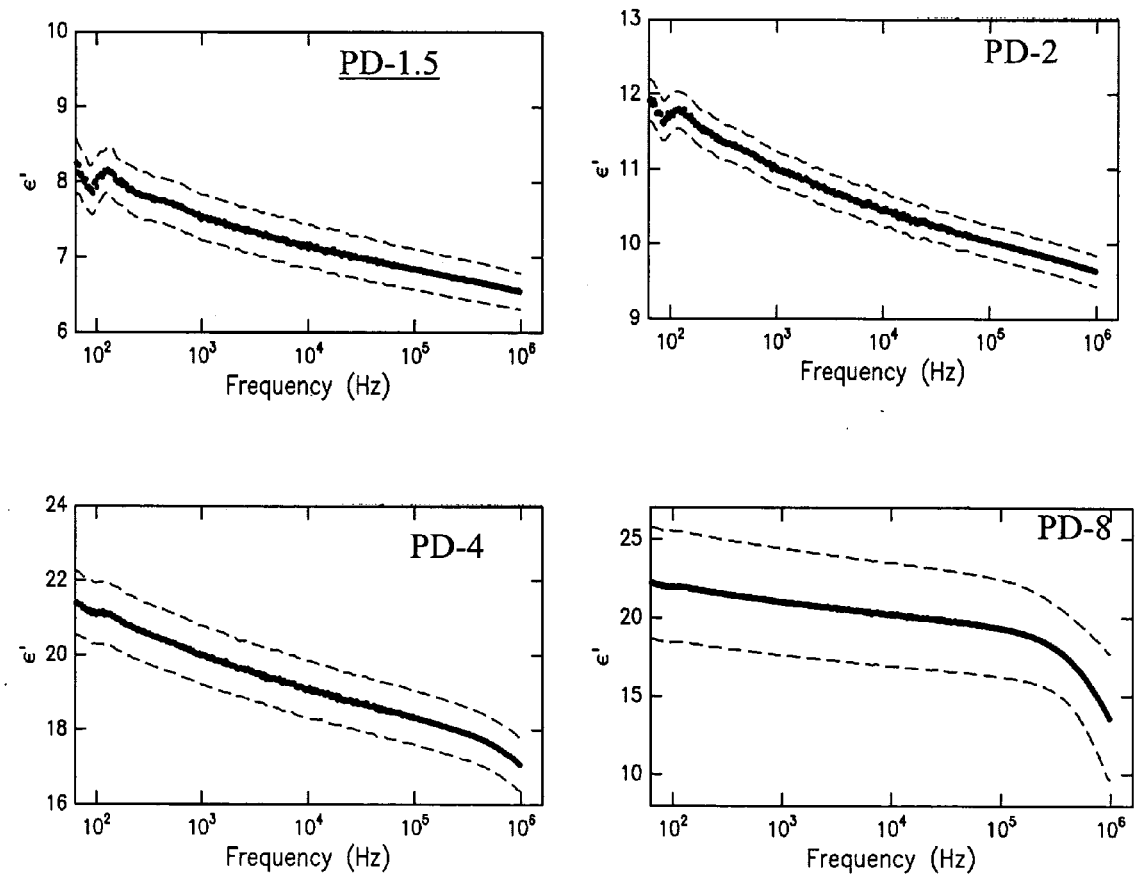
Figure 3: Frequency dependence of the real part of the dielectric response for thin films coated with dispersions of BaTiO$_3$.

Figure 4 – Micrograph of an array of thermally imaged source and drain lines, coated onto a dielectric layer made from a dispersion of $BaTiO_3$ with a P/D = 1.5.
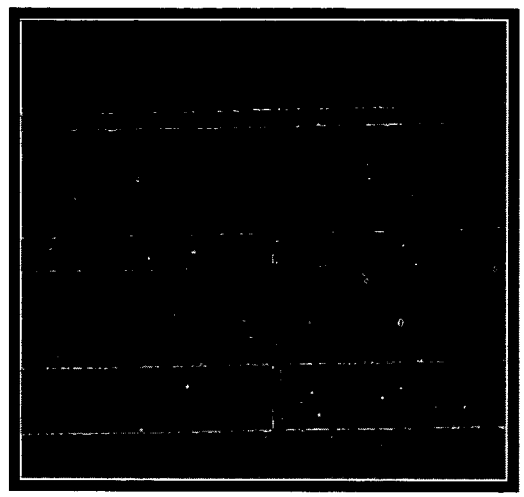

Figure 5: IV characteristics of TFT ITO gate/ PD-1.5 dielectric/printed PANI S/D and evaporated pentacene.
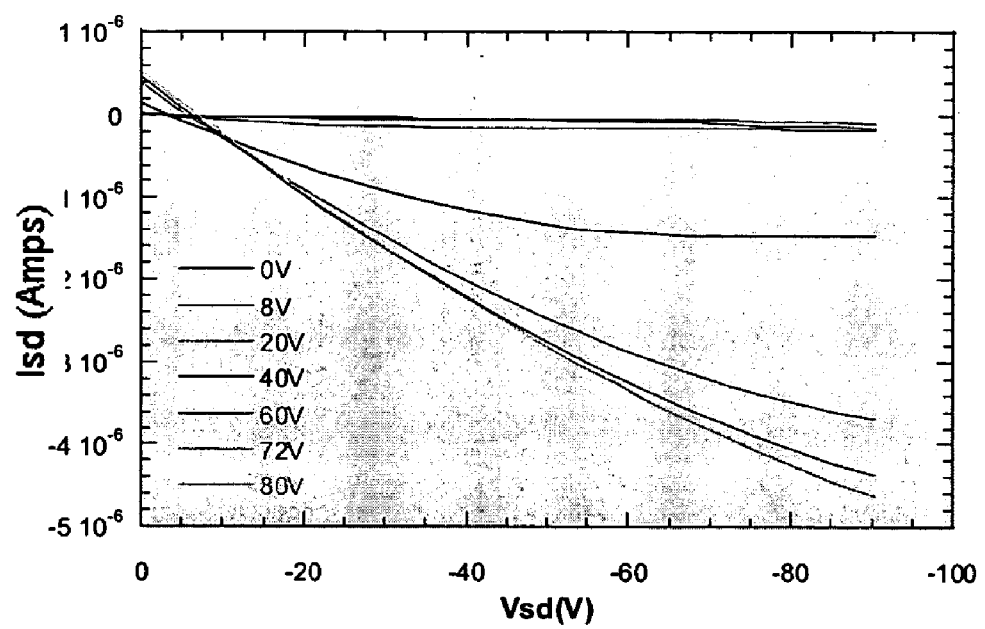

Figure 6: IV characteristic of TFT ITO gate/ PD-2 dielectric/printed PANI S/D and evaporated pentacene.
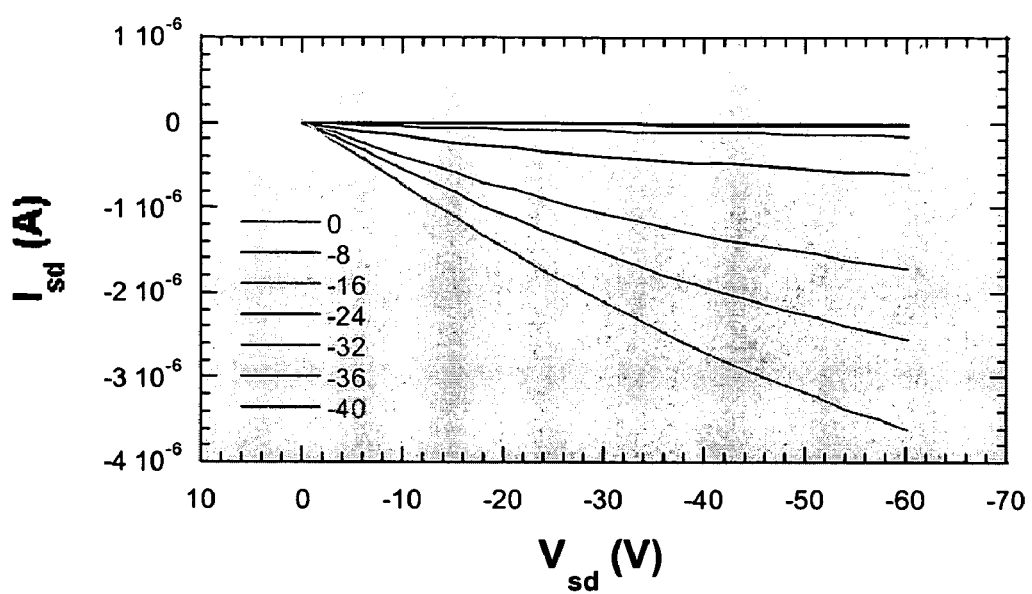

Figure 7: Micrograph of an inverter made with a PD-1.5 dielectric.
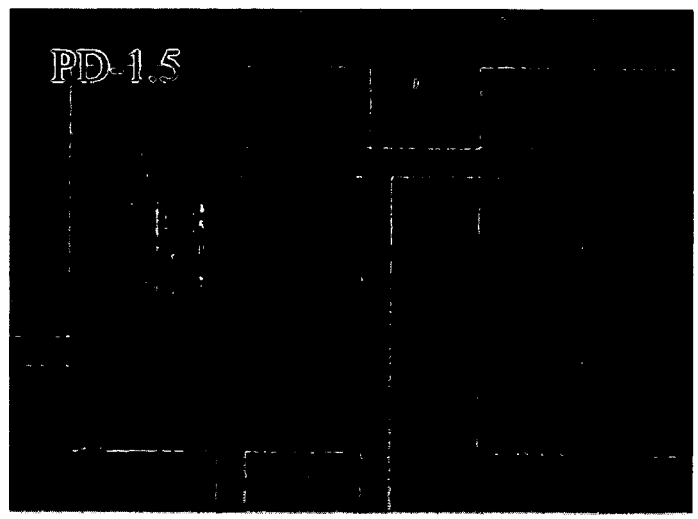

Figure 8: Micrographs of an inverter made with a PD-2.0 dielectric.
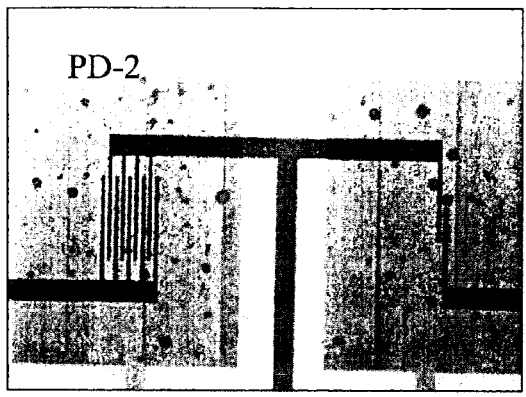
Gate, dielectric, source and drain regions interconnect
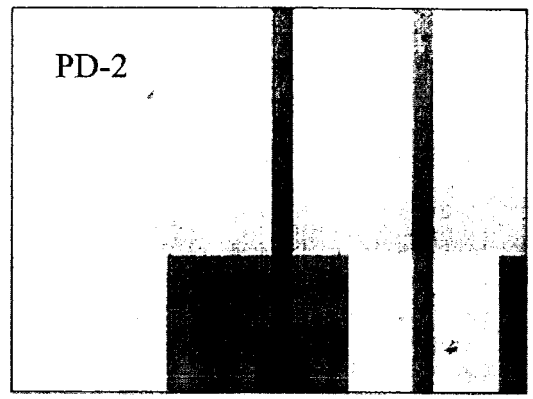
Dielectric edge and gate Figure 9: IV curve for an inverter made with a PD-2.0 dielectric
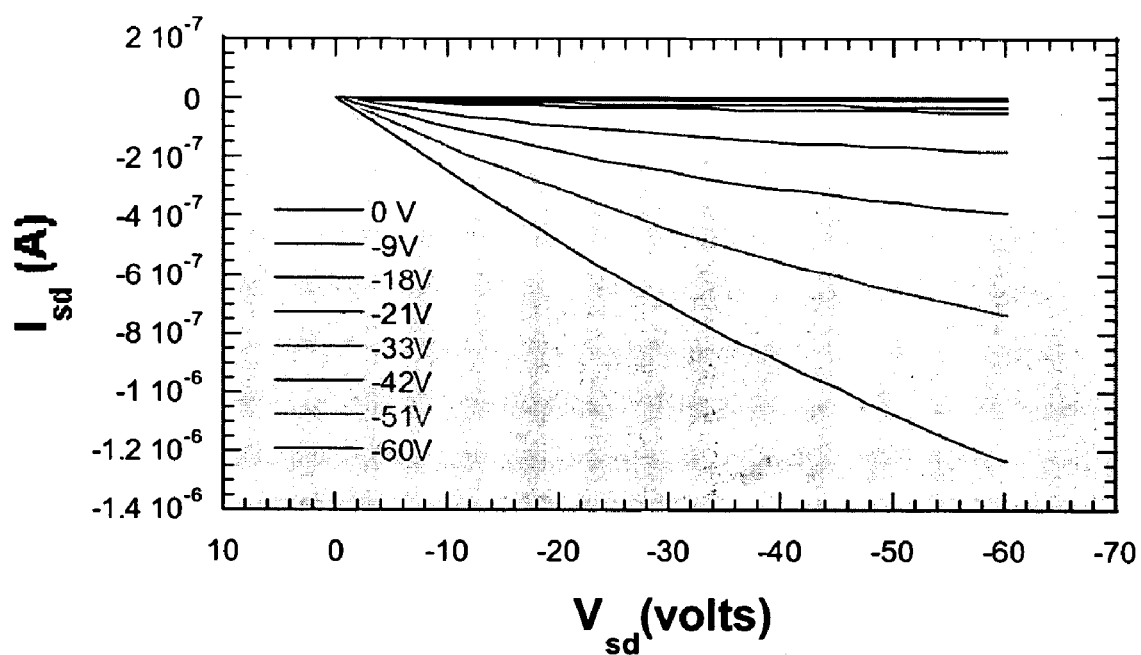

METHODS FOR FORMING PATTERNS ON A FILLED DIELECTRIC MATERIAL ON SUBSTRATES

FIELD OF THE INVENTION

This invention relates to methods for forming patterns of a dielectric material on substrates by a thermal transfer process. This invention also relates to donor elements that can be used to create organic thin film transistors.

TECHNICAL BACKGROUND OF THE INVENTION

Transistors made in whole or in part of organic materials can be less expensive and easier to manufacture than traditional transistors and can be used in applications where traditional transistors are not economical and high density is not required. For example, organic transistors could be used for electronic paper, posters and books, smart cards, toys, appliances and electronic bar codes for product identification. Organic transistors can also be made from flexible materials, and such transistors can be used to control diodes in flexible panel displays for computers, laptops and televisions.

The performance of TFT devices is typically characterized by examining the behavior of the "on" current ($I_{sd}$) measured in a regime where the source/drain voltage is larger than the gate voltage. Here the current, known as the saturation current, is independent of the source/drain voltage and can be related to other characteristics of the device according to Equation 1:

$$I_{sd} = \frac{W}{2L} C\mu(V_g - V_T)^2 \qquad \text{(Equation 1)}$$

where $\mu$ is the effective mobility of the semiconductor and C is the capacitance of the gate dielectric, which in turn is proportional to the dielectric constant $\epsilon$ of the dielectric layer. $V_g$ is the gate voltage and $V_T$ is the threshold voltage. Transistors that have large "on" currents possess some combination of large $\mu$, high $\epsilon$, and high C. The TFT output current is linearly dependent on the capacitance, proportional to the dielectric constant of the dielectric layer and inversely proportional to its thickness. Driving the transistor at low voltages requires either a very thin pinhole-free dielectric, or alternatively, a thicker dielectric with a high dielectric constant.

To be useful in a TFT, the dielectric layer must be fairly thin (~1 micron), possess a suitable $\epsilon$, and be essentially pinhole-free. At minimum, the dielectric must fully insulate the gate from the source and drain. A process is needed to create such dielectric layers with high-resolution features in a cost-effective manner.

SUMMARY OF THE INVENTION

This invention provides a novel thermal transfer process comprising:
a. forming a donor element comprising a transparent, dimensionally stable substrate in sheet form and a transfer layer, wherein the transfer layer comprises high dielectric constant nanoparticles and a dispersant or a polymer matrix;
b. placing the transfer layer of the donor element in contact with a receiver element; and
c. heating selected areas of the donor element to effect a transfer of portions of the transfer layer to the receiver element to form a multilayer structure.

This invention also provides a novel donor element, comprising:
a. a transparent, dimensionally stable substrate in sheet form; and
b. a transfer layer, comprising high dielectric constant nanoparticles and a dispersant or a polymer matrix.

BRIEF DESCRIPTION OF THE FIGURES

FIG. 1 shows a donor element and a receiver element for use in transferring dielectric material in accordance with one embodiment of the present invention.

FIG. 2 shows exposure of an assembly of the donor element and the receiver element of FIG. 1.

FIG. 3 shows the frequency dependence of the real part of the dielectric response for thin films coated from dispersions of $BaTiO_3$.

FIG. 4 shows a micrograph of an array of thermally imaged source and drain lines, coated onto a dielectric layer made from a dispersion of $BaTiO_3$ with a pigment/dispersant ratio of 1.5.

FIG. 5 shows a typical IV curve from a device with a PD-1.5 dielectric and channel width 1500 microns and channel length 500 microns.

FIG. 6 shows a typical curve from a device with a PD-2.0 dielectric and channel width 1500 microns and channel length 500 microns.

FIG. 7 shows a micrograph of an inverter transistor made with a PD-1.5 dielectric.

FIG. 8 shows micrographs of an inverter made with a PD-2.0 dielectric. The one on the left shows the gate, dielectric and source/drain regions, and the one on the right shows the dielectric edge and the gate interconnect.

FIG. 9 shows the IV curve for an inverter transistor made with a PD-2.0 dielectric.

DETAILED DESCRIPTION OF THE INVENTION

This invention provides a novel thermal transfer process comprising:
a. forming a donor element comprising a transparent, dimensionally stable substrate in sheet form and a transfer layer, wherein the transfer layer comprises high dielectric constant nanoparticles and a dispersant or a polymer matrix;
b. placing the transfer layer of the donor element in contact with a receiver element; and
c. heating selected areas of the donor element to effect a transfer of portions of the transfer layer to the receiver element to form a multilayer structure.

In the present invention, a novel thermal transfer process is disclosed for forming patterns of dielectric material, such as dispersions or polymer composites of high dielectric constant nanoparticles, on substrates. When the dielectric is patterned onto a patterned conductive material, it can be used in an electronic device, including an organic electronic device. For example, dielectric layers to be used in organic transistors can be formed.

Heating to effect the transfer of the donor element can be carried out by any of several means, including direct or indirect thermal heating, or laser-induced heating. Thermal transfer processes typically use a donor element, including a layer of material to be transferred ("transfer layer"), and a receiver element, including a surface for receiving the transferred material. For laser-induced thermal processes, either the substrate of the donor element or the receiver element is transparent, or both are transparent. The donor element and receiver element are brought into close proximity or into contact with each other and selectively heated or exposed to laser radiation, typically from an infrared laser.

In a laser process, heat is generated in the exposed portions of the transfer layer, causing the transfer of those exposed portions of the transfer layer onto the surface of the receiver element. If the material of the transfer layer does not absorb the incoming laser radiation, the donor element must include a heating layer adjacent to the transfer layer.

An ejection layer of a vaporizable polymeric material, which decomposes into gaseous molecules when heated, can also be provided between the heating layer and the donor support. Decomposition of the ejection layer provides additional force for propelling the exposed portions of the transfer layer onto the receiver element.

In one embodiment of a laser-induced digital thermal transfer process, exposure takes place only in a small, selected region of the assembly at a time, so that transfer of material from the donor element to the receiver element can be built up one pixel at a time. Computer control facilitates high-resolution and high-speed transfer. Alternatively, the entire assembly can be irradiated, using a mask to selectively expose desired portions of the thermally imageable layer.

The process of this invention can be used in the manufacture of a thin film transistor. For example, a pattern of organic semiconducting material can be deposited by conventional methods over a source and drain that have been printed on a substrate via thermal transfer or other methods. A pattern of dielectric material can be transferred by the process of this invention over the organic semiconducting material to form an insulation layer. The pattern of organic semiconducting material is preferably provided by methods such as evaporation through a shadow mask, ink jet, etc. Depositing a pattern of conductive material over the insulation layer forms a gate electrode.

Alternatively, a gate can be applied onto the substrate by conventional methods prior to the printing of the dielectric layer via thermal transfer. A source, a drain and interconnects can be applied over the organic dielectric material by conventional methods, followed by the semiconductor, to form a transistor. Alternatively, a layer of organic semiconducting material may be provided over the dielectric material prior to the source and drain formation.

The imaging process of the present invention can also be used to pattern multiple layers. For example, the transfer layer on the donor can comprise a first layer of conducting material adjacent to the substrate to form a gate electrode. A layer of dielectric material can be deposited over the layer of conducting material and transferred via a thermal process together with the conducting material. The conducting source and drains can then be deposited over the dielectric material via thermal imaging. Finally, a semiconducting layer can then be added by other conventional methods to complete the transistor.

This invention also provides a donor element, comprising a substrate for use in an organic electronic device and a transfer layer of a dielectric material on the substrate, wherein the dielectric material comprises high dielectric constant nanoparticles and a dispersant or a polymer matrix. This donor element can be used in the process of this invention to form patterned dielectric layers on a receiver element. Alternatively, unwanted portions of the layer of dielectric material can be removed from a donor element to form a desired pattern of dielectric material on the donor. The patterned dielectric can then be laminated onto a receiver element, for example onto a gate layer.

The Donor Element and the Receiver Element

FIG. 1 shows an exemplary donor element (10) and a receiver element (20) for use with the process of the present invention.

The donor element (10) comprises a substrate (14); a transfer layer (12) comprising a layer of dielectric material (18); and an optional heating layer (16) between the substrate (14) and the transfer layer (12). The substrate (14) provides support for the optional heating layer (16) and the transfer layer (12). The donor element (10) can also include an ejection layer (15). The ejection layer (15) is between the substrate (14) and the optional heating layer (16). The receiver element (20) comprises a receiver support (22) and an optional adhesive layer (24).

The receiver element (20) is typically positioned adjacent to the transfer layer (12) of the donor element (10) to receive exposed portions of the dielectric organic material (12) in the transfer step of the process of the present invention.

The substrate (14) and the receiver support (22) are dimensionally stable sheet materials. In one embodiment of this invention, the substrate (14) and the receiver support (22) are flexible to facilitate subsequent processing steps. For use in a laser-induced thermal transfer process, the substrate (14) must also be transparent to laser radiation to allow for exposure of the transfer layer (12).

Examples of transparent, flexible films appropriate for use as the substrate (14) include, for example, polyesters (e.g., polyethylene terephthalate), polyether sulfone, polyimides, poly(vinyl alcohol-co-acetal), polyethylenes, cellulose esters such as cellulose acetate, and polyvinyl chloride. In one embodiment of this invention, the substrate (14) of the donor element (10) is polyethylene terephthalate that has been plasma-treated to accept the optional heating layer (16). The same materials can be used for the receiver support (22). The receiver element (20) may also be an opaque material such as polyethylene terephthalate filled with a white pigment such as titanium dioxide, ivory paper, or synthetic paper such as Tyvek® spunbonded polyolefin.

Dielectric layers are preferably about 1–2 microns thick and can be transferred in accordance with the process of this invention. Thicker layers can also be used, as well. Although dielectric layers in organic electronic devices are typically about 1000 to 2000 Angstroms the particle composite dielectrics described here have higher dielectric constant, thus thicker dielectrics could be printed without higher voltage requirements in the devices.

Dielectric layers can alsb be applied to the support by any of a variety of methods, e.g., spin coating, casting or printing.

The dielectric layer comprises high dielectric constant nanoparticles and a dispersant or a polymer matrix. Suitable high dielectric constant nanoparticles include materials with a dielectric constant greater than 10, preferably greater than 100, more preferably greater than 1,000. Such materials include a wide variety of titanates, niobates, sulfides, tellurides, tantalates, zirconates, hafnates, and metal oxides. Specific examples include $BaTiO_3$ (barium titanate), $KTaNbO_3$ (potassium tantalum niobate), $KSr_2Nb_5O_{15}$ (potassium strontium niobate), $Pb_3MgNb_2O_9$ (lead magnesium niobate), SbSI (antimonous sulfide iodide), SnTe (time telluride), $SrTiO_3$ (strontium titanate), $MnO_2$ (manganese dioxide), $CaCu_3Ti_4O_{12}$ (calcium copper titanate), $BaTi_2Nb_8O_{30}$ (barium titanium niobate), $Cd_2Nb_2O_2$ (cadmium pyroniobate), $KIO_3$ (potassium iodate), $KNbO_3$ (potassium niobate), KTaO3 (potassium tantalate), $PbHfO_3$ (lead hafnate), $PbNb_2O_6$ (lead niobate), PbS (lead sulfide), PbSe (lead selenide), $PbTa_2O_6$ (lead metatantalate), PbTe (lead telluride), $PbTiO_3$ (lead titanate), $PbZrO_3$ (lead zirconate), $RbNO_3$ (rubidium nitrate), $Sb_2Se_3$ (antimonous selenide), SnSb (tin selenide), $TiO_2$ (titanium dioxide), $Al_2O_3$ (aluminum oxide) and $WO_3$ (tungsten trioxide). Some of these materials can be produced directly in appropriate nanoparticle sizes; other can be ground, milled or attrited to the desired size (generally less than 100 nm).

The dielectric layer can be formed by dispersing the nanoparticles in a solvent with a suitable dispersion aid, and then coating the dispersion on the donor support and evaporating the solvent. Suitable dispersion aids are generally those which are useful for metal oxide pigments and minerals. Alternatively, the nanoparticles can be dispersed in a polymer matrix including lattices and low molecular weight polymers, including polyethers, polyalcohols, polyamines, polyamides, and polyesters. Dispersion aids can be used with the nanoparticles to improve uniform mixing in the polymer matrix. The dielectric layer can be formed on the donor support from the nanoparticle/polymer mixture by any of several means, including coating, casting and lamination.

The function of the heating layer (16) of the donor element (10) is to absorb the laser radiation (R) used to expose the dielectric organic material of the transfer layer (12) and to convert the radiation into heat. The heating layer is typically a metal, e.g., Sc, Y, Ti, Zr, Hf, V, Nb, Ta, Cr, Mo, W, Ag, Fe, Ru, Os, Co, Rh, Ir, Ni, Pd, Pt, Ga, In, Tl, Sb, and Bi, their alloys with each other, and their alloys with Li, Na, K, Rb, Cs, Be, Mg, Ca, Sr, Ba, or Ra. Other suitable materials for the heating layer include carbon, a nonmetallic element. Electron beam-deposited nickel is preferred. It has been found that release of the transfer layer in a lamination step is facilitated when the nickel layer has been treated with an oxygen plasma.

Alternatively, the optional heating layer can be an organic layer comprising an organic binder and an infrared absorber. Examples of suitable binders are those that decompose at fairly low temperatures when heated, such as polyvinyl chloride, chlorinated polyvinyl chloride and nitrocellulose. Suitable near-infrared absorbers include carbon black and infrared dyes. Suitable infrared absorbing dyes include TIC-5c (2-[2-[2-chloro-3[[1,3-dihydro-1,3,3-trimethyl-2H-indol-2-ylidene) ethylidene]-1-cyclopenten-1-yl ]ethenyl]-1,3,3-trimethyl-3-H-indolium, salt with trifluoromethane sulfonic acid (1:1), CAS # 128433-68-1), available from E. I. DuPont de Nemours, Inc. (Wilmington, Del.). Alternative dyes which absorb at 830 nm include: ADS 830 (2-[2-[2-chloro-3-[2-[1,3-dihydro-1,1-dimethyl-3-(4-sulfobutyl)-2H-benz [e]indol-2-ylidene]ethylidene]-1-cyclohexen-1-yl]ethenyl]-1,1-dimethyl-3-(4-sulfobutyl)-1H-benz[e]indolium, inner salt, free acid, CAS # 162411-28-1); and SQS ((4-[[3-[[2,6-bis(1,1-dimethylethyl)-4H-thiopyran-4-ylidene]methyl]-2-hydroxy-4-oxo-2-cyclobuten-1-ylidene]methyl]-2,6-bis (1,1-dimethylethyl)-thiopyrylium, hydroxide, inner salt, CAS # 88878-49-3, also available from E. I. DuPont de Nemours, Inc. (Wilmington, Del.). If the laser used emits in other wavelength bands, then dyes should be chosen that absorb radiation in that particular wavelength band.

The thickness of the heating layer depends on the optical absorption of the metals used. For chromium, nickel/vanadium alloy or nickel, a layer of 80–100 Angstroms is preferred. A 40–50 Angstroms thick heating layer of aluminum shows high optical absorption. If carbon is used, the heating layer should be from about 500 to about 1,000 Angstroms thick.

Although it is preferred to have a single heating layer, it is also possible to have more than one heating layer, and the different layers can have the same or different compositions.

The heating layer (16) can be applied to the substrate (14) by a physical vapor deposition technique. Nickel can be electron beam deposited onto the substrate (14). Aluminum can be applied by resistive heating. Chromium, nickel and nickel/vanadium alloy layers can be applied by either sputtering or electron beam deposition.

The optional ejection layer (15) comprises a material with a low decomposition temperature, e.g., less than about 275° C. Suitable materials for the ejection layer include nitrocellulose, polyvinyl chloride, chlorinated polyvinyl chloride, polymethylmethacrylate and polymethacrylate copolymers. The ejection layer is preferably about 1 micron thick.

If the donor layer is exposed to the negative image and the dielectric on the exposed donor is subsequently transferred to a receiver substrate via lamination, it is important that the adhesion of the dielectric layer to the heating layer (16) to be less than the adhesion of the dielectric layer (18) to the receiver substrate. A release means is therefore preferably provided between the heating layer (16) and the dielectric layer (12). Alternatively, the release means can be provided by treating the heating layer (16) with an oxygen plasma. It has been found that oxygen plasma treatment of at least about 45 seconds and preferably about 90 seconds facilitates transfer of the desired pattern of the dielectric layer to the substrate by lamination, without damage to the dielectric material. An oxide layer can also be formed on the surface of the heating layer (16) adjacent to the layer of the dielectric material. The oxide layer typically has a thickness of a few monolayers. Additional release layers of monolayer thickness can also be coated directly onto the heating layer surface, such as by bar-coating.

Gas formers can also be included in the ejection layer (15) to increase the propulsive force generated in the ejection layer. Suitable gas formers include: diazo alkyls, diazonium salts, and azido ($-N_3$) compounds; ammonium salts; oxides, which decompose to form oxygen; carbonates and peroxides. Diazo compounds such as 4-diazo-N,N'-diethylaniline fluoroborate, can also be used, as well as mixtures of gas formers.

The adhesive layer (24) of the receiver element (20) can be a polycarbonate, a polyurethane, a polyester, polyvinyl chloride, styrene/acrylonitrile copolymer, poly(capro-lactone), vinylacetate copolymers with ethylene and/or vinyl chloride, (meth)acrylate homopolymers (such as butylmethacrylate), copolymers, and mixtures thereof. Pressure-sensitive adhesives can also be used.

Vacuum and/or pressure can be used to hold the donor element (10) and the receiver element (20) together to form the assembly (30). As one alternative, the donor element (10) and the receiver element (20) can be held together by fusion of layers at the periphery of the assembly (30). As another alternative, the donor element (10) and receiver element (20) can be taped together and taped to the imaging apparatus. A pin/clamping system can also be used. As yet another alternative, the donor element can be laminated to the receiver element.

If the donor element (10) and the receiver element (20) are flexible, the assembly (30) can be conveniently mounted on a drum to facilitate laser imaging. The assembly (30) is selectively exposed to heat, which is preferably in the form of laser radiation (R), in an exposure pattern of the image of the desired pattern to be formed on the substrate. (See FIG. 2). The laser radiation or laser beam (R) is focused on portions of the interface between (16) and (15), if present, otherwise it is focused between (16) and (12). The exposed portions of the transfer layer (12) heat the adjacent portions of the ejection and heating layers (15 and 16), causing decomposition and vaporization of the interface, and propelling the exposed portions of the transfer layer (12) from the transfer layer. Desired portions of the transfer layer (12) of dielectric material are thereby transferred to the receiver element (20).

The radiation is preferably applied through the substrate (14), as shown in FIG. 2. Laser radiation can be provided at a laser fluence of up to about 600 mJ/cm$^2$, preferably about 75–440 mJ/cm$^2$. Various types of lasers can be used to expose the metal heating layer (16). The laser preferably emits in the infrared, near-infrared or visible region. Particularly advantageous are diode lasers emitting in the region of 750 to 870 nm which offer a substantial advantage in terms of their small size, low cost, stability, reliability, ruggedness and ease of modulation. Diode lasers emitting in the range of 780 to 850 nm are most preferred. Such lasers are available from, for example, Spectra Diode Laboratories (San Jose, Calif.). Other types of lasers and lasers, which emit in other wavelength bands, may be used, as well.

Using the process of this invention, at least about 20,000 transistors can be made simultaneously on a 30-inch×40 inch substrate. Typically, each transistor is about 100 microns×100 microns and is separated from neighboring transistors by about 100 microns.

As used herein, the term "organic electronic device" refers to an electronic device in which any component, such as a semiconducting, conducting and dielectric component, is an organic material.

Also as used herein, the phrase "adjacent to" does not necessarily mean that one layer is immediately next to another layer. An intermediate layer or layers may be provided between layers said to be adjacent to each other.

The term "physical vapor deposition" refers to various deposition processes carried out in vacuum. Thus, for example, physical vapor deposition includes all forms of sputtering, including rf magnetron sputtering and ion beam sputtering, as well as all forms of vapor deposition, such as electron beam evaporation and chemical vapor deposition.

EXAMPLES

The non-limiting examples demonstrate the processes for the transfer of layers of filled dielectric material, as claimed and described herein.

Example 1

Pigment Dispersions

The BaTiO$_3$ pigment dispersion was prepared from Cabot BaTiO$_3$ nanoparticles (Cabot Corporation, Boston, Mass.) and DR-3 (a graft copolymer with an acrylate backbone, 69%, and methacrylate arms, 31%). The specific structure of backbone is n-butyl acrylate/methyl acrylate/acrylic acid (45/45/9), and that of the arms is methyl methacrylate/methacrylic acid (71.25/28.75), and is described in WO9421701A1. The pigment dispersion was prepared at 25% solids loading, with a pigment-to-dispersant ratio (P/D) of 2.0, as described in U.S. Pat. No. 5,231,131. A mixture of 236.16 g of water, 48.56 g of dispersant solution, and 6.92 g of 2-amino-2-methyl-1-propanol was charged, along with 58.36 g of BaTiO$_3$, to an attritor (Apollo® Trick Titanium, Troy, Mich.). The attritor contained 850 g of 0.8–1.0 micron zirconia media. The mixture was processed for 12 hours, keeping the temperature below 38° C. Filtration through a 1-micron filter produced the pigment dispersion.

Dispersions PD-1.5, PD4 and PD-8 were prepared in the same manner as PD-2 using the pigment dispersion ratio shown in Table 2.

TABLE 2

Compositions of Pigment Dispersions

| Pigment Dispersion | Pigment | P/D |
|---|---|---|
| PD-2 | BaTiO$_3$ | 2.0 |
| PD-8 | BaTiO$_3$ | 8.0 |
| PD-4 | BaTiO$_3$ | 4.0 |
| PD-1.5 | BaTiO$_3$ | 1.5 |

Example 2

The Dielectric function was measured in the standard configuration using a Hewlett Packard impedance analyzer. The dispersions described in Example 1 were spun at 1000 RPM onto ITO glass. After the thin film was dried, an aluminum electrode was evaporated onto the central area of the film for dielectric measurement.

The dielectric constants at zero frequency dielectric constant for PD-1.5, 2, 4 and 8 are about 8, 12, 21 and 22 respectively.

The frequency dependence of the real part of the dielectric response for frequency ranging from 0 to 10$^6$ Hertz for thin films coated as indicated from the dispersions PD-1.5, 2, 4 and 8 are shown in FIG. 3.

Example 3

The example below describes the transistor characteristics of thin film transistors comprising filled dielectric layers as the dielectric/insulating layer of an FET (field effect transistor). The device comprised a common gate, the dielectric layer, printed PANI/SWNT's source and drain and a semiconducting layer evaporated on top through a shadow mask. ("PANI/SWNT's" refer to composites of polyaniline (PANI) and single-walled nanotubes (Hipco SWNT, CNI Inc., Houston, Tex.). The gate, ITO with a 20 ohm/square resistivity (Courtaulds, Los Angeles, Calif.) was sputtered onto 10 mil Mylar® (0.254 mm), 400D optical clarity, available from E. I. DuPont de Nemours, Inc., Wilmington, Del. The ITO-coated Mylar®, 8" by 11" in size, was then coated with a 1.5 micron thick layer of PD-1.5 or PD-2 using Meyer rods 10. The films were air-dried overnight. The PANI source and drain electrodes were then printed via thermal transfer from a donor film. (The PANI donor element consisted of a 4 mil (0.0363 mm) thick base element of Mylar®, 400D optical clarity, a 100 Å thick layer of nickel coated by electron beam deposition to about 40% optical transmission, and a 1.5 micron thick PANI layer of the formulation below coated on top of the nickel layer.)

The ITO coated with PD-1.5 was loaded as a receiver onto a CREO 3244 Spectrum Trendsetter Exposure Unit available from Creo-Scitex, Inc., Vancouver, Canada. The drum on the Unit was 81.2-cm long drum, with a 91-cm perimeter. The laser of the Unit was a 20-watt infrared diode laser which emitted a laser beam at 830 nm at 1 microsecond pulse width. The laser beam was split by a light valve to form an array of overlapping 240 5×2 micron spots. The laser fluence was varied from 3 to 11 Watts and the drum speed was maintained at 100 RPM. The laser beam was focused at the nickel/dielectric interface. The interface decomposed upon exposure, and the gaseous decomposition products propelled the exposed portions of the PANI layer onto the filled dielectric layer of the ITO/Mylar®/dielectric receiver element. The adhesion of the PANI layer was sufficient for its adherence to the dielectric layer on the receiver element. The exposure pattern was a positive image of the desired arrangement of the PANI source and drain electrodes on the dielectric layer.

A micrograph of an array of thermally imaged source drain lines with the dimensions below is shown in FIG. 4.

Bottom line: Channel Width=2.5mm; Length=500-microns

Middle line: Channel Width=1.25mm; Length=250-microns

Top Line: Channel Width=0.625mm; Length=125-microns

After the polyaniline electrodes were printed the receiver was removed and placed in a vacuum chamber for pentacene evaporation. The sample was shadow masked such that pentacene extended 2–3 mm at each side of the channel. The system, Kurt Lesker, evaporator comprise a high vacuum chamber with a mechanical and cryo pumps. The sample was placed in a sample holder and rotated during deposition to assure uniform thickness. The chamber's pressure during deposition was $4\times10^{-8}$ torr. The pentacene (Sigma-Aldrich, Milwaukee, Wis.) was placed in a ceramic boat surrounded by heating elements that assured uniform temperature. Temperature in the crucible was controlled within 0.5° C. As the desirable crucible temperature was achieved, a shutter positioned between the sample and the crucible was opened. The rate of evaporation was 0.3 Å/s, the final temperature was 207.1° C., and the pentacene sample thickness was 125 Å. After the sample was cooled to ambient temperature, it was removed from the vacuum chamber and the current-voltage characteristic of the transistor were measured. A typical IV curve from a device with a PD-1.5 dielectric and channel width and length of 1500 and 500 microns, respectively, is shown in FIG. 5. The mobility of the device was calculated to be 0.12 $Cm^2$/V-sec and the transistor on/off ratio was 6000.

The IV characteristics of devices with coated PD-2 dielectric was also measured. The procedure was identical to that previously described for PD-1.5. A typical IV curve from a device with a PD-2 dielectric and channel width and length of 1500 and 500 microns, respectively, is shown in FIG. 6. The mobility of the device was calculated to be 0.08 $cm^2$/Vs and the transistor on/off ratio was 1000.

Example 4

This example illustrates a method for printing a dielectric layer comprising a dispersed $BaTiO_3$. The conducting layers on this example are used as a gate, source and drains in the building of plastic transistors via thermal imaging. The laser beam is split by a light valve to form an array of overlapping 240 5×2 micron spots. The laser fluence for the exposure of the gate and source/drain layer was 3.45 Watts and the drum speed was 100 RPM.

The gate and source/drains layer were fabricated using a donor film comprising a 100 A layer of Ni coated via electron beam deposition directly on 400D Mylar® to about 40% optical transmission. The transfer layer coated from the solution described below was rod coated to 1.2 micron in thickness.

The PANI transfer layer solution was prepared by adding 0.075 g of Hipco Carbon Nanotubes (CNI, Houston, Tex.) and 19.1425 g of xylene into a 2-oz. container. The mix was then sonicated for 20 minutes while maintaining a good vortex of the slurry. DNNSA-PANI (dinonylnaphthalene sulfonic acid polyaniline) 19.1425 g (41.4% solution in xylenes) was then added and the resulting mix further sonicated for 5 minutes. The resulting slurry at about 10% solids was diluted with xylene to 6% solids and then coated to a 1 micron film using Meyer rod #10. The film contained 3% SWNT (single-walled nanotubes) and 97% polyaniline. The receiver comprised a 5-micron Elvax® film extruded onto 400D Mylar® (E. I. DuPont de Nemours, Inc.). The PANI donor layer was loaded onto the proofing cassette and the image of the inverter gate transferred onto a receiver. The image of the gate layer is formed in the following fashion: The laser beam is focused onto the metal interface. The heat generated initiates the decomposition of the organics in the adjacent interfaces, which leads to the transfer of the PANI onto the receiver. After the exposure is completed, the image on the receiver comprises a gate layer of PANI/SWNT. The second donor layer consisted of a 400D Mylar® substrate, 80 Å electron beam deposited Ni, and a 1 micron layer of PD-1.5 coated using Meyer rod #10. The second donor was loaded and the filled dielectric (PD-1.5) transferred onto the gate layer. After this layer was completed, an additional dielectric layer of the same pattern was transferred onto of the first one. After the imaging of the dielectric was completed, a PANI /SWNT donor was loaded onto the Unit, and the source/drain layer was imaged on top and in registry. The receiver was then removed and pentacene was evaporated onto the inverter transistor. As shown in the micrograph in FIG. 7, the transfer of the conducting transfer layer by thermal imaging allows for very accurate control of line widths and channel widths. The channel lengths for the five transistors on the left and single transistor on the right are 30 microns.

Data for one of the P/D 1.5 transistors with printed gate W=4000 μm and L=40 μm. The measured mobility of m=0.02 $cm^2$Ns, with an on/off ratio of ~15000.

A second inverter was printed as described above, using PD-2. The detailed image is shown in FIG. 8. The IV characteristics are shown in FIG. 9.

The width and length of the transistors above are W=4000 μm and L=40 μm. The measured mobility 0.002 $cm^2$Ns with an on/off ration of ~2000.

What is claimed is:

1. An article, comprising:
    a. a transparent, dimensionally stable substrate in sheet form;
    b. a transfer layer, comprising high dielectric constant nanoparticles dispersed in a solvent or a polymer matrix wherein the polymer matrix is selected from polyalcohols, polyamines, polyamides, and polyesters; and
    c. a heating layer located between the substrate and the transfer layer.

2. The article of claim 1, further comprising an ejection layer between the substrate and the transfer layer.

3. The article of claim 2, wherein the ejection layer comprises an organic material having a decomposition temperature less then 275° C., and wherein the organic material is selected from the group consisting of polyvinyl chloride, chlorinated polyvinyl chloride, polymethylmethacrylate, polymethacrylate copolymers, and nitrocellulose.

4. The article of claim 1, wherein the substrate is flexible.

5. The article of claim 1, wherein the substrate comprises a plasma-treated polyester sheet.

6. The article of claim 1, wherein the heating layer comprises carbon, a metal, a metal alloy or an organic binder and an infrared absorber.

7. The article of claim 6, wherein the heating layer comprises Ni, Al, Cr, W, V, or C.

8. The article of claim 7, wherein the heating layer comprises electron beam-deposited Ni.

* * * * *